United States Patent
Nie et al.

(10) Patent No.: US 11,862,259 B2
(45) Date of Patent: Jan. 2, 2024

(54) ELECTRONIC DEVICE, OVER-ERASE DETECTION AND ELIMINATION METHODS FOR MEMORY CELLS

(71) Applicant: CHINA FLASH CO., LTD., Shanghai (CN)

(72) Inventors: Hong Nie, Shanghai (CN); Ying Sun, Shanghai (CN)

(73) Assignee: CHINA FLASH CO., LTD. SHANGHAI, Shanghai (CN)

( * ) Notice: Subject to any disclaimer, the term of this patent is extended or adjusted under 35 U.S.C. 154(b) by 0 days.

(21) Appl. No.: 17/899,167

(22) Filed: Aug. 30, 2022

(65) Prior Publication Data

US 2023/0063964 A1    Mar. 2, 2023

(30) Foreign Application Priority Data

Sep. 2, 2021  (CN) .......................... 202111026432.6

(51) Int. Cl.
G11C 16/04    (2006.01)
G11C 16/34    (2006.01)

(52) U.S. Cl.
CPC ............................... *G11C 16/3477* (2013.01)

(58) Field of Classification Search
CPC ................................................. G11C 16/3477
USPC ...................................................... 365/185.3
See application file for complete search history.

(56) References Cited

U.S. PATENT DOCUMENTS

| | | | | |
|---|---|---|---|---|
| 6,285,599 B1* | 9/2001 | Shimada | ................ | G11C 16/16 365/185.29 |
| 6,834,012 B1* | 12/2004 | He | ..................... | G11C 16/3404 365/185.29 |
| 2002/0031012 A1 | 3/2002 | Chen et al. | | |
| 2002/0186590 A1* | 12/2002 | Lee | ........................ | G11C 7/18 365/185.17 |
| 2003/0147286 A1 | 8/2003 | Tanaka et al. | | |
| 2009/0122617 A1* | 5/2009 | Noh | .................. | G11C 16/3404 365/185.24 |

(Continued)

FOREIGN PATENT DOCUMENTS

| CN | 102568594 A | 6/2019 |
|---|---|---|
| CN | 109872755 A | 6/2019 |

(Continued)

*Primary Examiner* — Hoai V Ho
(74) *Attorney, Agent, or Firm* — Tianhua Gu; GLOBAL IP SERVICES

(57) ABSTRACT

An electronic device, and an over-erase detection and elimination method for memory cells are provided; the method includes: performing an erase operation on a specified area; selecting all the memory cells in the selected area one by one; measuring a threshold voltage of a selected memory cell for over-erase detection to see if it is less than a normal erase threshold voltage; if not, selecting the next memory cell for over-erase detection, and if yes, then performing a soft-write operation on the selected memory cell; after the soft-write operation, performing over-erase detection again to see whether the threshold voltage of the selected memory cell is within a normal threshold range; and if not, performing a soft-write operation again, and if yes, the next memory cell is selected for over-erase detection, until the threshold voltages of all the memory cells selected for erasure are within the normal threshold range.

6 Claims, 3 Drawing Sheets

(56) References Cited

U.S. PATENT DOCUMENTS

2010/0226178 A1\* 9/2010 Nirschl .............. G11C 16/3404
                                                    365/185.09
2011/0273936 A1\* 11/2011 Yu ........................ G11C 16/16
                                                    365/185.11

FOREIGN PATENT DOCUMENTS

| | | |
|---|---|---|
| CN | 109872759 A | 6/2019 |
| JP | 2001351389 A | 12/2001 |
| JP | 2005182480 A | 7/2005 |
| JP | 2006028875 A | 2/2006 |
| JP | 2008045284 A | 2/2008 |
| JP | 6847295 B1 | 3/2022 |
| KR | 10-2001-0054407 | 7/2001 |
| KR | 10-2020-0052664 | 5/2020 |

\* cited by examiner

ELECTRONIC DEVICE, OVER-ERASE DETECTION AND ELIMINATION METHODS FOR MEMORY CELLS

CROSS REFERENCE TO RELATED APPLICATION

The present application claims the benefit of priority to Chinese Patent Application No. CN 2021110264326, entitled "ELECTRONIC DEVICE, OVER-ERASE DETECTION AND ELIMINATION METHODS FOR MEMORY CELLS", filed with CNIPA on Sep. 2, 2021, the disclosure of which is incorporated herein by reference in its entirety for all purposes.

FIELD OF TECHNOLOGY

The present disclosure relates to the field of semiconductor storage technology, in particular, to an over-erase detection and elimination method for memory cells and an electronic device.

BACKGROUND

In conventional storage devices, erase operations are performed using a strong electric field potential to achieve erasure of memory cells, and their erase speed is relatively lower compared to their program and read speeds. If one of the memory cells is not erased successfully, it is necessary to re-apply the strong electric field for a second erasure, or more. As a result, a threshold voltage of a memory cell may become lower than the threshold voltage for normal erasure if during one operation the memory cell is erased for multiple times. Such a state of the memory cell is called an over-erase state, and over-erase states directly affect operation of storage devices.

Therefore, how to identify and eliminate over-erase states and ensure proper operation of storage devices has become one of the pressing issues for those skilled in the art.

SUMMARY

The present disclosure provides an over-erase detection and elimination method for memory cells, including:
 S1: performing an erase operation on memory cells in a storage device;
 S2: selecting a memory cell as a memory cell to be tested, and measuring a threshold voltage of the memory cell to be tested; executing operation S5 if the measured threshold voltage is within a predetermined threshold range; and executing operation S3 if the measured threshold voltage is less than the lower limit of the predetermined threshold range;
 S3: performing a soft-write operation on the memory cell to be tested, in order to raise the threshold voltage of the memory cell to be tested;
 S4: measuring again the threshold value of the memory cell to be tested, executing operation S5 if the measured threshold voltage is within the predetermined threshold range; repeating operation S3 if the measured threshold voltage is less than the lower limit of the predetermined threshold range;
 S5: selecting a next memory cell and returning to operation S2, and repeating the process until threshold voltages of all the memory cells selected are within the predetermined threshold range.

Optionally, the storage device is NOR FLASH.

Optionally, in operation S2 and operation S4, a first positive voltage is applied to a word line of the memory cell to be tested, a second positive voltage is applied to a bit line of the memory cell to be tested, and a source of the memory cell to be tested is connected to a 0 V voltage; wherein a negative voltage is applied to word lines of memory cells that are not selected, bit lines of memory cells that are not selected are connected to a 0 V voltage, and sources of memory cells that are not selected are connected to a 0 V voltage.

More optionally, the first positive voltage is between 0.2 V and 2 V, the second positive voltage is between 0.7 V and 1.1 V, and the negative voltage is between −2 V and −1 V.

Optionally, in operation S3, a third positive voltage is applied to the word line of the memory cell to be tested, a fourth positive voltage is applied to the bit line of the memory cell to be tested, and the source of the memory cell to be tested floats, wherein the third positive voltage is less than a programing word line voltage (the voltage at the word line during a programming operation), and the fourth positive voltage is equal to a programing bit line voltage (the voltage at the bit line during a programming operation); word lines, bit lines, and sources of unselected memory cell are connected to a 0 V voltage.

More optionally, the third positive voltage is from 1 V to 3 V and the fourth positive voltage is from 7 V to 9 V.

More optionally, the predetermined threshold range is from 0 V to 2.5 V.

The present disclosure also provides an electronic device, including: an instruction memory and a processor.

The instruction memory and the processor are communicatively connected to each other, the instruction memory has computer instructions stored therein, the processor executes the computer instructions, thereby executing the over-erase detection and elimination method for memory cells as described above.

As described above, the over-erase detection and elimination method for memory cells and the electronic device of the present disclosure, have the following beneficial effects:

The over-erase detection and elimination method for memory cells and the electronic device of the present disclosure can effectively detect and eliminate over-erase states of memory cells; at the same time, sources of the memory cells float during soft-write operations, which can reduce operating currents and power consumption of the memory cells.

REFERENCE NUMERALS

1—Processor; 2—Instruction memory.

DETAILED DESCRIPTION

The following describes the implementation of the present disclosure through specific examples, and those skilled in the art can easily understand other advantages and effects of the present disclosure from the content disclosed in this specification. The present disclosure can also be implemented or applied through other different specific embodiments. Various details in this specification can also be modified or changed based on different viewpoints and applications without departing from the spirit of the present disclosure.

Figure 1:
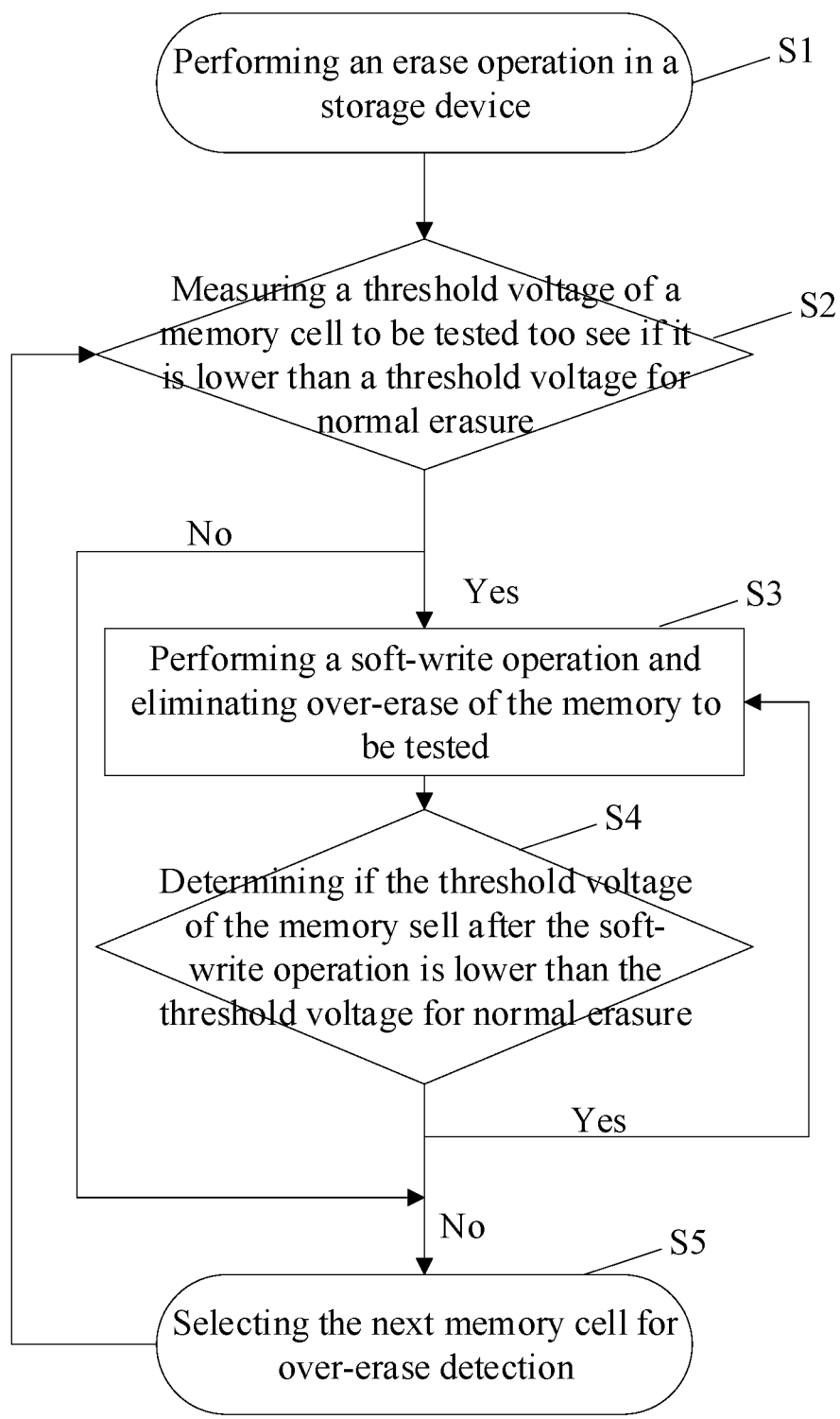
FIG. 1 shows a flow chart illustrating an over-erase detection and elimination method for memory cells of the present disclosure.
Figure 4:
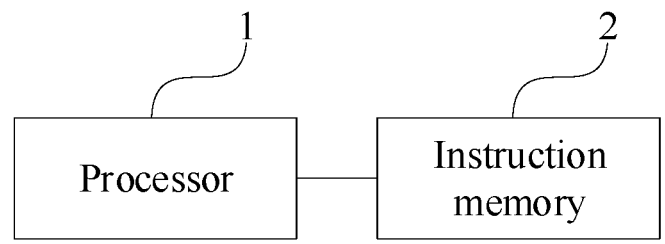
FIG. 4 shows a schematic structural diagram of an electronic device of the present disclosure.

Please refer to FIG. 1 and FIG. 4. It should be noted that the drawings provided in this disclosure only illustrate the basic concept of the present disclosure in a schematic way, so the drawings only show the components related to the present disclosure. The drawings are not necessarily drawn according to the number, shape and size of the components in actual implementation; during the actual implementation, the type, quantity and proportion of each component can be changed as needed, and the components' layout can also be more complicated.

Embodiment 1

As shown in FIG. 1, this embodiment provides an over-erase detection and elimination method for memory cells, comprising:

S1: performing an erase operation on memory cells in a storage device.

Specifically, a storage device is provided; as an example, the storage device is NOR FLASH; during the actual implementation, any storage device with an over-erase state is applicable. The storage device receives an erase instruction and performs an erase operation on a memory cell in a specified area of the storage device, and the erase operation may be repeated for one or more times as needed to ensure that all the memory cells in the specified area are erased. As an example, a negative bias voltage is applied to a gate (word line) of the memory cell, a high voltage is applied to a substrate of the memory cell, and electrons stored in a floating gate of the memory cell enter the substrate from the floating gate through F-N tunneling, which completes the erase operation for once.

It should be noted that the erase operation can be carried out simultaneously for all the memory cells in the specified area, or that the specified area can be partitioned into parts and the erase operation can be carried out for memory cells in one part of the specified area each time, or that the memory cells in the specified area can be erased one by one.

S2: selecting a memory cell as the memory cell to be tested, measuring a threshold voltage of the memory cell to be tested; if the measured threshold voltage is within a predetermined threshold range, then executing operation S5; if the measured threshold voltage is less than the lower limit of the predetermined threshold range, then executing operation S3.

Specifically, after erase operations for all the memory cells is completed, the memory cells in the specified area are selected one by one, and then for each memory cell selected, it is tested for over-erase by the following method: the threshold voltage of the memory cell to be tested is obtained, then compared to the predetermined threshold voltage range, and if the threshold voltage of the memory cell is within the predetermined threshold range, it is determined that the memory cell is not over-erased; if the threshold voltage of the memory cell is less than the lower limit of the predetermined threshold range, it is determined that the memory cell is over-erased. As an example, the predetermined threshold range is between 0 V and 2.5 V, and during the actual implementation, the predetermined threshold range can be adjusted according to device characteristics.

Figure 2:
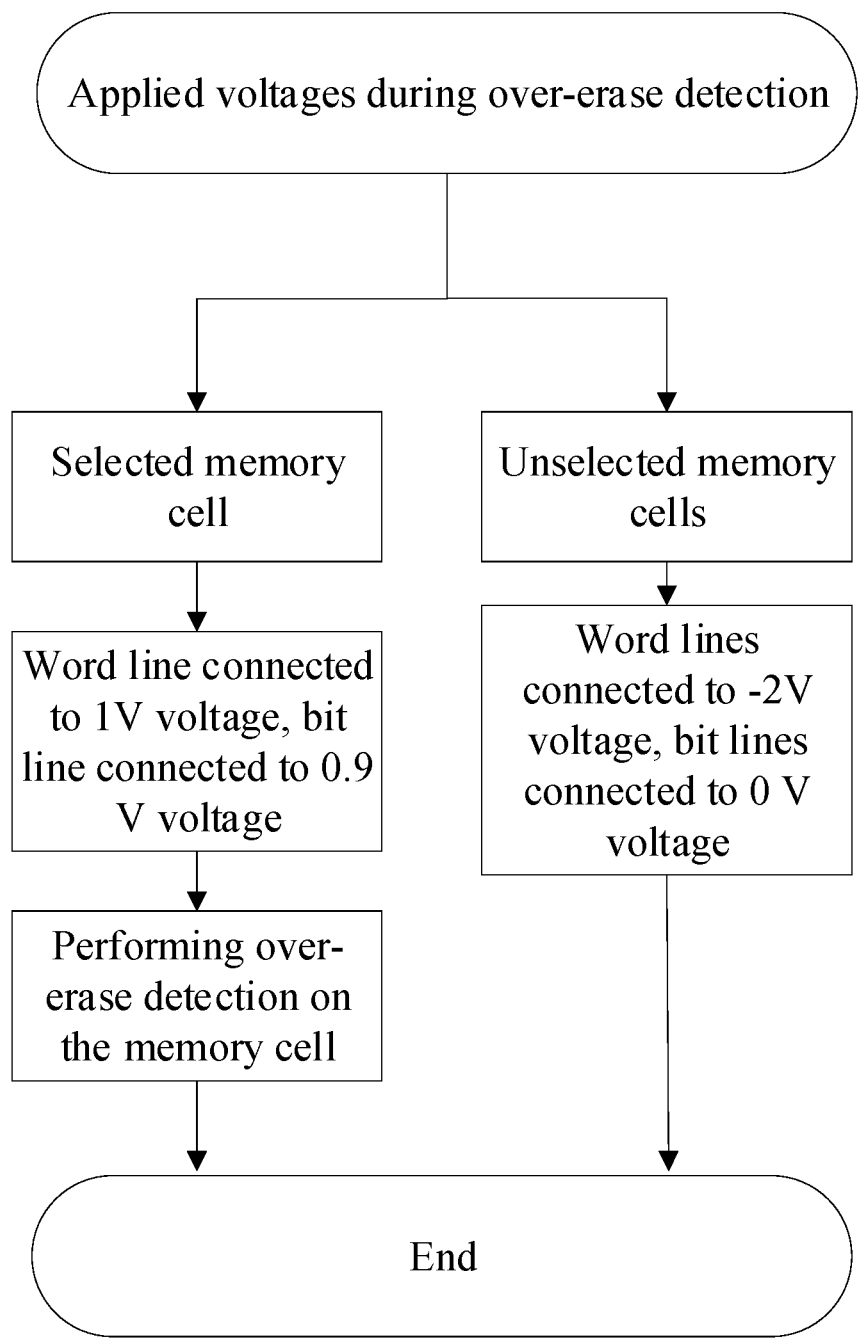
FIG. 2 shows a flow chart illustrating over-erase detection of the present disclosure.

More specifically, as shown in FIG. 2, the word line of the selected memory cell to be tested is applied with a first positive voltage, and its bit line is applied with a second positive voltage, its source is connected to 0 V and its substrate is connected to 0 V; subsequently, the current at the drain of the memory cell to be tested is read, and if there is no current output (read 0), it is determined that the memory cell to be tested has not been erased, and if there is a current output (read 1), it is determined that the memory cell to be tested has been erased. In this embodiment, the first positive voltage is between 0.2 V and 2 V, and as an example, the first positive voltage is 1 V; the second positive voltage is between 0.7 V and 1.1 V, and as an example, the second positive voltage is 0.9 V; during the actual implementation, the voltages applied to the word line and the bit line can be set according to the operating voltage of the storage device, doping type, etc., as long as the voltages are able to strobe the memory cell to be tested and compare the threshold voltage of the memory cell to be tested with the predetermined threshold voltage.

More specifically, as shown in FIG. 2, word lines of unselected memory cells are applied with a negative voltage, bit lines of the unselected memory cells are connected to a 0 V voltage, their sources are connected to 0 V voltage, and their substrates are connected to a 0 V voltage. In this embodiment, the negative voltage is between −2 V and −1 V, and as an example, the negative voltage is −2 V; during the actual implementation, the voltages applied to the word lines and the bit lines can be set according to the operating voltage of the storage device, doping type, etc., as long as it is ensured that the unselected memory cells do not affect the over-erase detection of the selected memory cell.

S3: performing a soft-write operation on the memory cell to be tested, in order to raise the threshold voltage of the memory cell to be tested.

Specifically, when it is detected that the memory cell to be tested is in an over-erase state in operation S2, the over-erase state of the memory cell will be eliminated.

Figure 3:
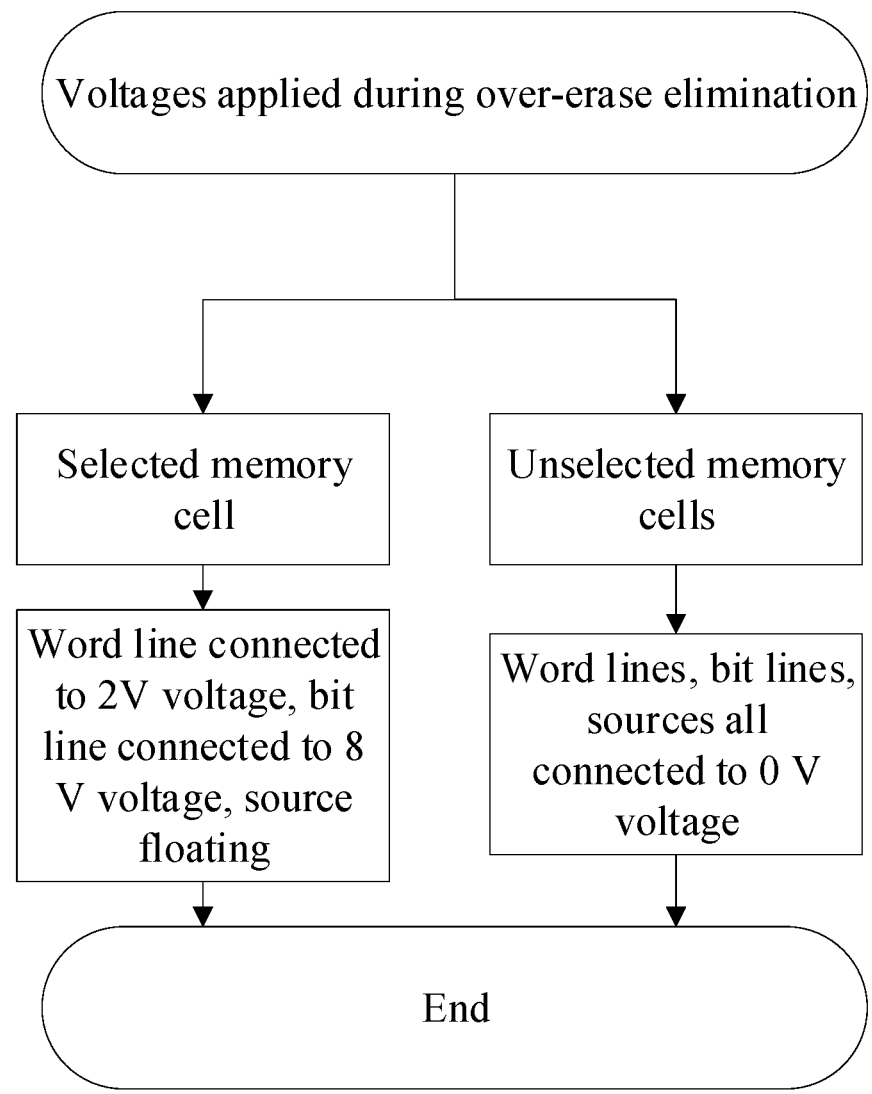
FIG. 3 shows a flow chart illustrating over-erase elimination of the present disclosure.

More specifically, as shown in FIG. 3, the selected memory cell has a third positive voltage applied to its word line, and a fourth positive voltage applied to its bit line, its source floats, and its substrate is connected to a 0 V or negative voltage (as an example, the negative voltage is not less than −3.5 V), wherein the third positive voltage is less than the programming word line voltage (as an example, the programming word line voltage is between 4.3V and 5 V), the fourth positive voltage is the programming bit line voltage (as an example, the programming bit line voltage is between 7V and 9V); at this time, under the action of an electric field, primary electrons hit the drain to generate holes, the holes hit the substrate to generate secondary electrons, and the secondary electrons enter the floating gate, which in turn increases the threshold voltage of the memory cell to be tested. In this embodiment, the third positive voltage is between 1 V and 3 V, and as an example, the third positive voltage is between 2V; the fourth positive voltage is between 7V and 9V. As an example, the fourth positive voltage is between 8V; during the actual implementation, the corresponding word line voltage and bit line voltage can be selected according to the operating voltage of the memory, doping type, etc. as long as the voltages are enough to strobe the memory cell to be tested and increase the threshold voltage of the memory cell to be tested so as to perform a soft-write operation.

More specifically, as shown in FIG. 3, word lines, bit lines, sources, and substrates of the unselected memory cells are connected to 0 V voltage. During the actual implementation, the voltages applied to the sources, word lines and bit lines of the unselected memory cells can be set according to the operating voltage of the storage device, doping type, etc., as long as it is ensured that the unselected memory cells do not affect the over-erase elimination of the selected memory cell.

S4: measuring again the threshold value of the memory cell to be tested, executing operation S5 if the measured threshold voltage is within the predetermined threshold range; repeating operation S3 if the measured threshold voltage is less than the lower limit of the predetermined threshold range.

Specifically, the method adopted in operation S2 is also used to detect over-erase of the memory cell that has undergone soft-write operation in operation S3.

Specifically, operation S3 and operation S4 are executed cyclically until the threshold value of the memory cell to be tested falls within the predetermined threshold value.

S5: selecting a next memory cell and returning to operation S2, and repeating the process until threshold voltages of all the memory cells selected are within the predetermined threshold range.

Specifically, after over-erase detection and elimination of a current memory cell is completed (if no over-erase is detected, there is no need for elimination thereof), the next memory cell is selected for over-erase detection, and if it in an over-erase state, this over-erase state will also be eliminated, and the rest of the memory cells are not selected; such a process is repeated until detection and elimination of over-erase of all memory cells in the specified area is completed The over-erase detection and elimination method for memory cells of the present disclosure can effectively detect over-erase of a memory cell and restore its threshold voltage to a normal threshold voltage range if it is over-erased, thus eliminating over-erase and ensuring the normal operation of the storage device; at the same time, over-erase is eliminated while the source of the memory cell floats, which can reduce operating currents and power consumption of the memory cell.

Embodiment 2

As shown in FIG. 4, this embodiment provides an electronic device that includes a processor 1 and an instruction memory 2, wherein the processor 1 and the instruction memory 2 are interconnected through a bus or a communication interface.

Specifically, the processor 1 may be any type of available device having information processing functions, such as a central processing unit or a digital signal processor, etc., for executing computer instructions stored in the instruction memory 2 to implement an over-erase detection and elimination method for memory cells as described in embodiment 1; the instruction memory 2 is connected to the processor 1 and may be chosen from a variety of available storage media for storing instructions executable by the processor 1.

The present disclosure provides an electronic device, and an over-erase detection and elimination method for memory cells; the method comprises: after a storage device receives an erase instruction, performing an erase operation on a specified area, and when the erase operation is completed, selecting all the memory cells in the selected area one by one respectively, measuring a threshold voltage of a selected memory cell to see if it is less than a normal erase threshold voltage; if not, selecting the next memory cell for over-erase state detection, and if yes, then performing a soft-write operation on the selected memory cell, in order to restore its threshold voltage to be within the normal threshold voltage range (that is, what a threshold voltage range of a memory cell would normally be after a proper erase operation); after the soft-write operation, performing over-erase state detection again to see whether the threshold voltage of the selected memory cell is within the normal threshold voltage distribution; and if not, performing a soft-write operation again, and if yes, the next memory cell is selected for over-erase state detection, until the threshold voltages of all the memory cells selected for erasure are within the normal threshold voltage distribution. The invention can effectively detect and eliminate over-erase of memory cells; at the same time, the source of each memory cell floats during soft-write operations, which can reduce operating currents and power consumption of the memory cell. Therefore, the present disclosure effectively overcomes various shortcomings of the prior art and has a high value for industrial application.

The above-mentioned embodiments only exemplarily illustrate the principles and effects of the present disclosure, but are not used to limit the present disclosure. Any person skilled in the art may modify or change the above embodiments without violating the spirit and scope of the present disclosure. Therefore, all equivalent modifications or changes made by those skilled in the art without departing from the spirit and technical concepts disclosed by the present disclosure should still be covered by the attached claims of the present disclosure.

What is claimed is:

1. An over-erase detection and elimination method for memory cells, comprising:
    S1: performing an erase operation on memory cells in a storage device;
    S2: selecting, from the memory cells, a memory cell to be tested and measuring a threshold voltage of the memory cell to be tested; executing operation S5 if the measured threshold voltage is within a predetermined threshold range; and executing operation S3 if the measured threshold voltage is less than the lower limit of the predetermined threshold range;
    S3: performing a soft-write operation on the memory cell to be tested, in order to raise the threshold voltage of the memory cell to be tested; wherein a third positive voltage is applied to the word line of the memory cell to be tested, a fourth positive voltage is applied to the bit line of the memory cell to be tested, and the source of the memory cell to be tested floats, wherein the third positive voltage is less than a programing word line voltage, and the fourth positive voltage is equal to a programing bit line voltage;
    S4: measuring again the threshold value of the memory cell to be tested, executing operation S5 if the measured threshold voltage is within the predetermined threshold range; repeating operation S3 if the measured threshold voltage is less than the lower limit of the predetermined threshold range; and
    S5: selecting, from the memory cells, a next memory cell and returning to operation S2, and repeating the process until threshold voltages of all the memory cells selected are within the predetermined threshold range;
    wherein in operation S2 and operation S4, a first positive voltage is applied to a word line of the memory cell to be tested, a second positive voltage is applied to a bit line of the memory cell to be tested, and a source of the memory cell to be tested is connected to a 0 V voltage;

wherein a negative voltage is applied to word lines of memory cells that are not selected, bit lines of the memory cells that are not selected are connected to a 0 V voltage, and sources of the memory cells that are not selected are connected to a 0 V voltage.

2. The over-erase detection and elimination method for memory cells according to claim 1, wherein the first positive voltage is between 0.2 V and 2 V, and the second positive voltage is between 0.7 V and 1.1 V, and the negative voltage is between −2 V and −1 V.

3. The over-erase detection and elimination method for memory cells according to claim 1,
wherein in operation S3, word lines, bit lines, and sources of unselected memory cell are connected to a 0 V voltage.

4. The over-erase detection and elimination method for memory cells according to claim 3, wherein the third positive voltage is between 1 V and 3 V and the fourth positive voltage is between 7 V-9 V.

5. The over-erase detection and elimination method for memory cells according to claim 1, wherein the predetermined threshold range is from 0 V to 2.5 V.

6. An electronic device, wherein the electronic device comprises:
an instruction memory and a processor;
wherein the instruction memory and the processor are communicatively connected to each other, the instruction memory has computer instructions stored therein, and the processor executes the computer instructions, thereby executing an over-erase detection and elimination method for memory cells according to claim 1.

* * * * *